(12) United States Patent
Huang

(10) Patent No.: US 11,874,324 B2
(45) Date of Patent: Jan. 16, 2024

(54) DEVICE FOR CARRYING CHIP, AND DEVICE AND METHOD FOR TESTING CHIP

(71) Applicant: CHANGXIN MEMORY TECHNOLOGIES, INC., Hefei (CN)

(72) Inventor: Jinrong Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 164 days.

(21) Appl. No.: 17/648,450

(22) Filed: Jan. 20, 2022

(65) Prior Publication Data

US 2023/0003792 A1 Jan. 5, 2023

Related U.S. Application Data

(63) Continuation of application No. PCT/CN2021/120133, filed on Sep. 24, 2021.

(30) Foreign Application Priority Data

Jul. 1, 2021 (CN) .......................... 202110750882.3

(51) Int. Cl.
  *G01R 31/28* (2006.01)
  *H01R 33/94* (2006.01)

(52) U.S. Cl.
  CPC ..... *G01R 31/2884* (2013.01); *G01R 31/2893* (2013.01); *H01R 33/94* (2013.01)

(58) Field of Classification Search
  CPC .............. G01R 19/257; G01R 31/2884; G01R 31/3004; G01R 31/3181; G01R 31/31813
  See application file for complete search history.

(56) References Cited

U.S. PATENT DOCUMENTS

| | | | | |
|---|---|---|---|---|
| 7,887,356 | B1* | 2/2011 | Cheng .................. | H05K 7/1069 439/331 |
| 2009/0075499 | A1* | 3/2009 | Szu ...................... | H05K 7/1053 439/68 |
| 2010/0159732 | A1* | 6/2010 | Yeh ...................... | H05K 7/1053 439/366 |

FOREIGN PATENT DOCUMENTS

| CN | 201622288 U | 11/2010 |
|---|---|---|
| CN | 204495961 U | 7/2015 |
| CN | 207096284 U | 3/2018 |
| CN | 210037887 U | 2/2020 |
| CN | 211148723 U | 7/2020 |
| CN | 213529714 U | 6/2021 |

OTHER PUBLICATIONS

International Search Report cited in PCT/CN2021/120133 dated Mar. 22, 2022, 9 pages.

* cited by examiner

*Primary Examiner* — Tung X Nguyen

(74) *Attorney, Agent, or Firm* — Cooper Legal Group, LLC

(57) ABSTRACT

The present disclosure relates to a device for carrying a chip, and a device and a method for testing a chip. The device for carrying a chip is configured to fasten chips of different sizes, and includes a support box and a plurality of first elastic snap rings. The support box is configured to carry a chip. A first connection terminal of the first elastic snap ring is provided on a first inner side wall of the support box, a second connection terminal of the first elastic snap ring is suspended, and is configured to be in contact with the chip and provide a pressure in a first direction for the chip because an elastic body of the first elastic snap ring is in an elastically compressed state.

13 Claims, 2 Drawing Sheets

DEVICE FOR CARRYING CHIP, AND DEVICE AND METHOD FOR TESTING CHIP

CROSS-REFERENCE TO RELATED APPLICATIONS

This is a continuation of International Application No. PCT/CN2021/120133, filed on Sep. 24, 2021, which claims the priority to Chinese Patent Application No. 202110750882.3, titled "DEVICE FOR CARRYING CHIP, AND DEVICE AND METHOD FOR TESTING CHIP" and filed with the China National Intellectual Property Administration (CNIPA) on Jul. 1, 2021. The entire contents of International Application No. PCT/CN2021/120133 and Chinese Patent Application No. 202110750882.3 are incorporated herein by reference.

TECHNICAL FIELD

The present disclosure relates to, but is not limited to, a device for carrying a chip, and a device and a method for testing a chip.

BACKGROUND

A chip die and different types of frames or molding compounds form a chip package body. There are many types of chip package bodies, which are generally divided into different types according to packaging materials of the chip package bodies, connection manners of the chip package bodies and a printed circuit board (PCB), and the appearance of the chip package bodies. The chip package bodies need to be tested before leaving the factory, so as to improve the quality of products.

In a process of testing a chip package body, a test pin thereof needs to be electrically connected to a test circuit. In order to facilitate the fixed connection between the test circuit and the chip package body, a carrier device meeting a test requirement of the chip package body needs to be provided. It can provide a test electrical signal to the chip package body through the test circuit and the test pin of the chip package body fastened to the carrier device, to test performance and reliability of the chip package body.

However, different types of chip package bodies have different dimensions, and chip package bodies of a same type may have different sizes of test pins. As a result, if matching test devices are respectively provided for various types of chip package bodies, it will obviously cause a waste of resources, which is not conducive to the reduction of test costs.

SUMMARY

An overview of the subject matter detailed in the present disclosure is provided below, which is not intended to limit the protection scope of the claims.

The present disclosure provides a device for carrying a chip, and a device and a method for testing a chip.

A first aspect of the present disclosure provides a device for carrying a chip, configured to fasten chips of different sizes, and including a support box and a plurality of first elastic snap rings. The support box is configured to carry a chip. A first connection terminal of the first elastic snap ring is provided on a first inner side wall of the support box, a second connection terminal of the first elastic snap ring is suspended, and is configured to be in contact with the chip and provide a pressure in a first direction for the chip because an elastic body of the first elastic snap ring is in an elastically compressed state, such that the chip is fastened between the second connection terminal and a second inner side wall of the support box opposite to the first inner side wall.

Another aspect of the present disclosure provides a device for testing a chip, including a test circuit board and the device for carrying a chip described in any embodiment of the present disclosure, configured to carry the test circuit board and fasten a chip to an upper surface of the test circuit board, wherein the test circuit board is configured to provide a test signal for the chip, to test the chip.

Still another aspect of the present disclosure provides a method for testing a chip, including:
loading a test circuit board into the device for carrying a chip described in any embodiment of the present disclosure;
loading a chip into the device for carrying a chip, and fastening the chip to an upper surface of the test circuit board, wherein the chip is fastened between a second connection terminal of a first elastic snap ring and a second inner side wall of a support box; and
controlling the test circuit board to provide a test signal for the chip, to test the chip.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are part rather than all of the embodiments of the present disclosure. Those skilled in the art may derive other drawings based on these drawings without creative efforts.

REFERENCE NUMERALS

10. support box; 20. first elastic snap ring; 21. first connection terminal; 22. second connection terminal; 23. elastic body; 24. anti-slip material; 30. second elastic snap ring; 30a. first fixing terminal; 30b. second fixing terminal; 10a. first inner side wall; 10b. second inner side wall; 10c. third inner side wall; 10d. fourth inner side wall; 40. test circuit board; 50. Chip.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Figure 1:
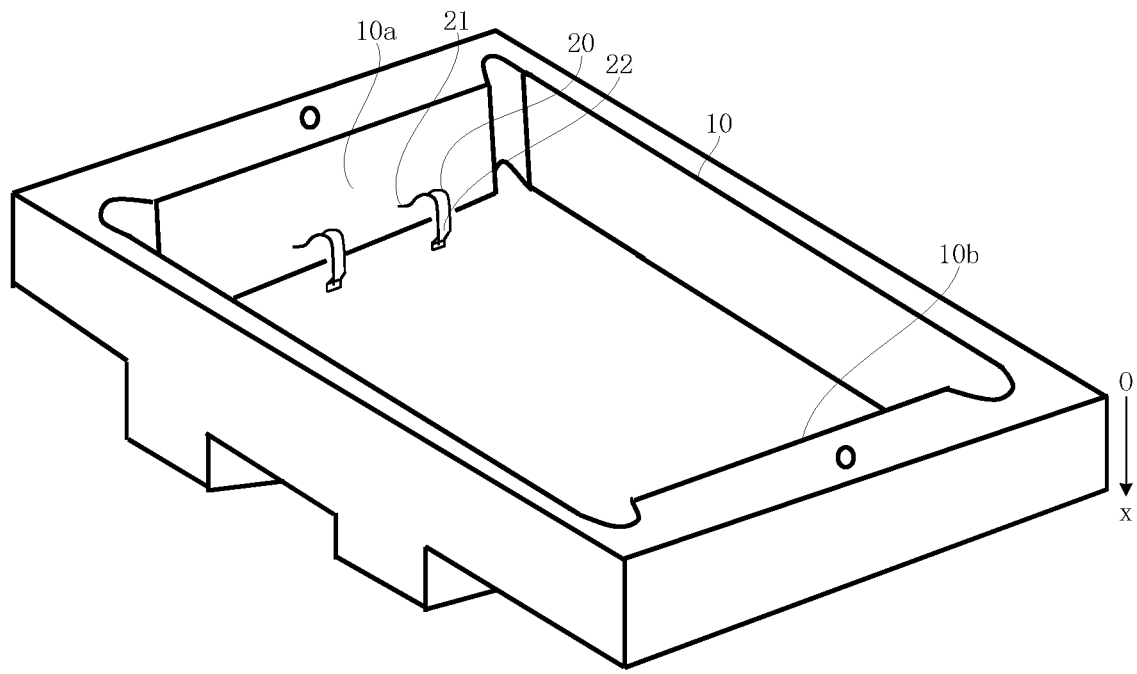
FIG. 1 is a schematic structural diagram of a device for carrying a chip according to an embodiment of the present disclosure.
Figure 2:
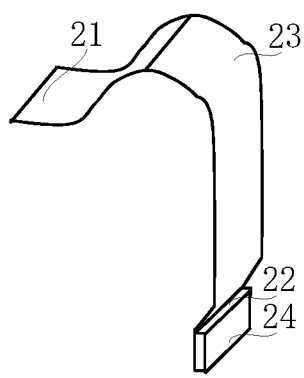
FIG. 2 is a schematic structural diagram of a first elastic snap ring in the embodiment shown in FIG. 1.

Referring to FIG. 1 and FIG. 2, in an embodiment of the present disclosure, a device for carrying a chip is provided, configured to fasten chips of different sizes (not shown in FIG. 1 and FIG. 2), and including a support box 10 and a plurality of first elastic snap rings 20. The support box 10 is configured to carry a chip. A first connection terminal 21 of the first elastic snap ring 20 is provided on a first inner side wall 10a of the support box 10. A second connection terminal 22 of the first elastic snap ring 20 is suspended, and is configured to be in contact with the chip and provide a pressure in a first direction for the chip because an elastic body 23 of the first elastic snap ring 20 is in an elastically compressed state, such that the chip is elastically fastened between the second connection terminal 22 of the first elastic snap ring 20 and a second inner side wall 10b of the support box 10 opposite to the first inner side wall 10a. In this embodiment, the first direction may be a length direction of the support box 10. Because a distance between the second connection terminal 22 of the first elastic snap ring 20 and the second inner side wall 10b falls within a preset length range, various chips of different types and shapes and/or volumes can be fastened therebetween.

As an example, still referring to FIG. 1 and FIG. 2, in an embodiment of the present disclosure, an extension direction of the second connection terminal 22 of the first elastic snap ring 20 is parallel to a thickness direction Ox of the chip, to help press the chip into the device for carrying a chip from the extension direction of the second connection terminal 22 of the first elastic snap ring 20.

As an example, still referring to FIG. 1 and FIG. 2, in an embodiment of the present disclosure, an end of the second connection terminal 22 of the first elastic snap ring 20 is in contact with a top surface of a test circuit board 40 located on a bottom surface inside the support box 10; and a length of the second connection terminal 22 of the first elastic snap ring 20 along the thickness direction of the chip is greater than or equal to a thickness of the chip. This helps press the chip into the device for carrying a chip from the extension direction Ox of the second connection terminal 22 of the first elastic snap ring 20, until the chip is in contact with the top surface of the test circuit board 40 located on the bottom surface inside the support box 10, such that the chip is electrically connected to the test circuit board 40, thereby helping the test circuit board 40 provide a test electrical signal for the chip.

As an example, still referring to FIG. 1 and FIG. 2, in an embodiment of the present disclosure, an orthographic projection of the end of the second connection terminal 22 of the first elastic snap ring 20 on the bottom surface is located inside an orthographic projection of the elastic body 23 of the first elastic snap ring 20 on the bottom surface, to help snap-fasten the chip between the end of the second connection terminal 22 and the second inner side wall 10b of the support box 10 opposite to the first inner side wall 10a.

As an example, still referring to FIG. 1 and FIG. 2, in an embodiment of the present disclosure, a surface of the second connection terminal 22 of the first elastic snap ring 20 close to the chip is provided with an anti-slip material 24, to improve friction between the end of the second connection terminal 22 of the first elastic snap ring 20 and the chip snap-fastened between the end of the second connection terminal 22 of the first elastic snap ring 20 and the second inner side wall 10b of the support box 10. The anti-slip material 24 may include anti-slip sand, or rubberized anti-slip fibers, or the like.

As an example, still referring to FIG. 1 and FIG. 2, the first elastic snap ring 20 is provided on the first inner side wall 10a of the support box 10 configured to carry the chip, such that the first connection terminal 21 of the first elastic snap ring 20 is fixedly connected to the first inner side wall 10a of the support box 10 and the second connection terminal 22 of the first elastic snap ring 20 is suspended, and is configured to be in contact with the chip located inside the support box 10 and provide a pressure in the first direction for the chip because the elastic body 23 of the first elastic snap ring 20 is in the elastically compressed state, such that the chip is elastically fastened between the second connection terminal 22 and the second inner side wall 10b of the support box 10 opposite to the first inner side wall 10a, and the device for carrying a chip can fasten chips of different types, different shapes, and different volumes, thereby reducing test costs for various types of chips while improving chip test efficiency.

As an example, still referring to FIG. 2, in an embodiment of the present disclosure, the elastic body 23 of the first elastic snap ring 20 is of an ear shape. This helps press the chip into the device for carrying a chip from the extension direction Ox of the second connection terminal 22 of the first elastic snap ring 20, until the chip is in contact with the top surface of the test circuit board located on the bottom surface inside the support box 10, and the chip is snap-fastened between the end of the second connection terminal 22 of the first elastic snap ring 20 and the second inner side wall 10b of the support box 10 opposite to the first inner side wall 10a.

As an example, in an embodiment of the present disclosure, a shape of the elastic body 23 of the first elastic snap ring 20 may include at least one of a round shape, a C shape, a spiral shape, a wave shape, an ear shape, or an L shape, to help provide various appropriate elastic snap rings meeting snap-fastening requirements of different types of chips.

Figure 3:
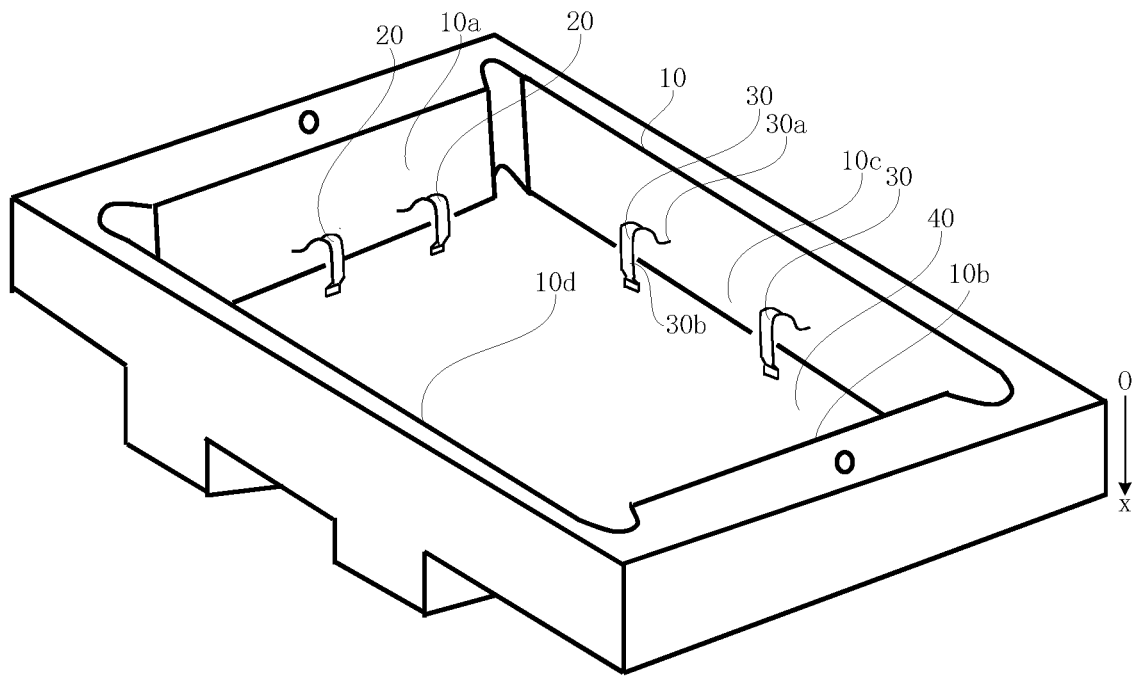
FIG. 3 is a schematic structural diagram of a device for carrying a chip according to another embodiment of the present disclosure.

As an example, referring to FIG. 3, in an embodiment of the present disclosure, the second inner side wall 10b of the support box 10 is provided with a plurality of first elastic snap rings 20, to help multi-directionally snap-fasten the chip located inside the support box 10.

Figure 4:
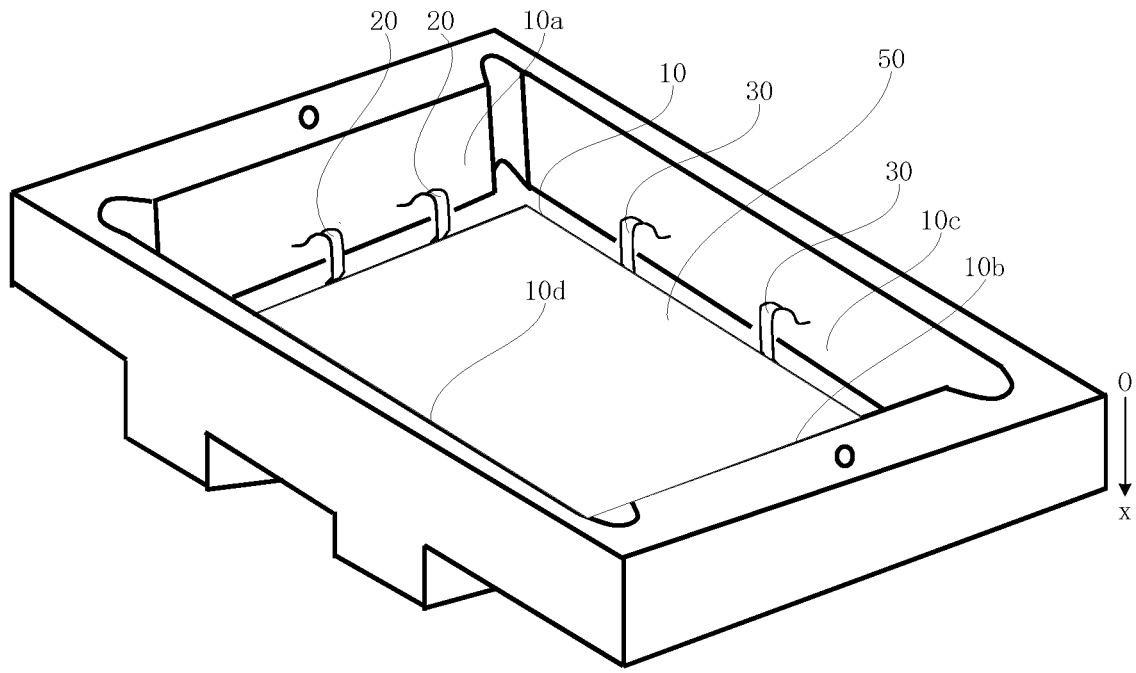
FIG. 4 is a schematic application diagram of a device for carrying a chip according to an embodiment of the present disclosure.

As an example, referring to FIG. 3 and FIG. 4, in an embodiment of the present disclosure, the device for carrying a chip further includes a plurality of second elastic snap rings 30, a first fixing terminal 30a of the second elastic snap ring 30 is provided on a third inner side wall 10c of the support box 10 adjacent to the first inner side wall 10a, a second fixing terminal 30b of the second elastic snap ring 30 is suspended, and is configured to be in contact with the chip 50 and provide a pressure in a second direction for the chip 50 because an elastic body of the second elastic snap ring 30 is in the elastically compressed state, such that the chip 50 is fastened between the second fixing terminal 30b of the second elastic snap ring 30 and a fourth inner side wall 10d of the support box 10 opposite to the third inner side wall 10c, to help provide the pressure in the second direction for the chip 50 fastened inside the support box 10, thereby improving stability of the chip 50 snap-fastened inside the support box 10. In this embodiment, the second direction intersects with the first direction. For example, the second direction may be set to a width direction of the support box 10.

As an example, still referring to FIG. 3 and FIG. 4, in an embodiment of the present disclosure, an extension direction of the second fixing terminal 30b of the second elastic snap ring 30 is parallel to the thickness direction Ox of the chip 50, to help press the chip into the device for carrying a chip from the extension direction of the second fixing terminal 30b of the second elastic snap ring 30.

As an example, still referring to FIG. 3 and FIG. 4, in an embodiment of the present disclosure, an end of the second fixing terminal 30b of the second elastic snap ring 30 is in contact with the top surface of the test circuit board 40 located on the bottom surface inside the support box 10; and a length of the second fixing terminal of the second elastic snap ring 30 along the thickness direction Ox of the chip 50 is greater than or equal to the thickness of the chip 50. This helps press the chip into the device for carrying a chip along the extension direction of the second fixing terminal 30b of the second elastic snap ring 30, until the chip is in contact with the top surface of the test circuit board (not shown in FIG. 4) located on the bottom surface inside the support box 10, such that the chip is electrically connected to the test circuit board 40, thereby helping the test circuit board 40 provide a test electrical signal for the chip.

As an example, still referring to FIG. 3 and FIG. 4, in an embodiment of the present disclosure, an orthographic projection of the second fixing terminal 30b of the second elastic snap ring 30 on the bottom surface of the support box 10 is located inside an orthographic projection of the elastic body 23 of the second elastic snap ring 30 on the bottom surface, to help snap-fasten the chip between the second elastic snap ring 30 and the fourth inner side wall 10d opposite to the third inner side wall 10c.

As an example, still referring to FIG. 3 and FIG. 4, in an embodiment of the present disclosure, a surface of the second fixing terminal 30b of the second elastic snap ring 30 close to the chip 50 is provided with an anti-slip material, to improve friction between the end of the second fixing terminal 30b of the second elastic snap ring 30 and the chip 50 snap-fastened between the end of the second fixing terminal 30b of the second elastic snap ring 30 and the inner side wall of the support box 10. The anti-slip material may include anti-slip sand, or rubberized anti-slip fibers, or the like.

As an example, still referring to FIG. 3, in an embodiment of the present disclosure, the elastic body of the second elastic snap ring 30 is of an ear shape. This helps press the chip into the device for carrying a chip from the extension direction of the second fixing terminal 30b of the second elastic snap ring 30, until the chip is in contact with the top surface of the test circuit board located on the bottom surface of the support box 10, and the chip is snap-fastened to an inner side of the support box 10.

As an example, still referring to FIG. 3, in an embodiment of the present disclosure, a shape of the elastic body of the second elastic snap ring 30 may include at least one of a round shape, a C shape, a spiral shape, a wave shape, an ear shape, or an L shape, to help provide various types of appropriate elastic snap rings meeting snap-fastening requirements of different types of chips.

Still referring to FIG. 3, in an embodiment of the present disclosure, a device for testing a chip is provided, including a test circuit board 40 and the device for carrying a chip described in any embodiment of the present disclosure, where the chip carrier chip is configured to carry the test circuit board 40 and fasten a chip to an upper surface of the test circuit board 40, and the test circuit board 40 is configured to provide a test signal for the chip, to test the chip. The device for testing a chip in this embodiment can test chips of different types, different shapes, and different volumes without replacing the device for carrying a chip, thereby reducing test costs for various types of chips while improving chip test efficiency.

In an embodiment of the present disclosure, a method for testing a chip is provided, including:

loading a test circuit board into the device for carrying a chip described in any embodiment of the present disclosure;

loading a chip into the device for carrying a chip, and fastening the chip to an upper surface of the test circuit board, where the chip is fastened between the second connection terminal of the first elastic snap ring and the second inner side wall of the support box; and controlling the test circuit board to provide a test signal for the chip, to test the chip.

The method for testing a chip in the foregoing embodiment can test chips of different types, different shapes, and different volumes without replacing the device for carrying a chip, thereby reducing test costs for various types of chips while improving chip test efficiency.

For specific limitations of the method for testing a chip in the foregoing embodiment, reference may be made to the limitations of the device for carrying a chip above, and details are not described herein again.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation" and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more accompanying drawings are denoted by similar reference numerals. For the sake of clarity, various parts in the accompanying drawings are not drawn to scale. In addition, some well-known parts may not be shown. For the sake of brevity, the structure obtained by implementing a plurality of steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the device for carrying a chip provided in the present disclosure, a first elastic snap ring is provided on a first inner side wall of a support box configured to carry a chip, such that a second connection terminal of the first elastic snap ring is suspended to provide pressure for the chip located inside the support box, such that the chip is elastically fastened inside the support box, and the device for carrying a chip can fasten chips of different types, different shapes, and different volumes, thereby reducing test costs for various types of chips while improving chip test efficiency.

The invention claimed is:

1. A device for carrying a chip, configured to fasten chips of different sizes, comprising:
   a support box, configured to carry a chip; and
   a plurality of first elastic snap rings, a first connection terminal of each of the first elastic snap rings being provided on a first inner side wall of the support box, a second connection terminal of each of the first elastic snap rings being suspended and being configured to be in contact with the chip and provide a pressure in a first direction for the chip because an elastic body of each of the first elastic snap rings is in an elastically compressed state, such that the chip is fastened between the second connection terminal and a second inner side wall of the support box opposite to the first inner side wall, wherein:
      an extension direction of the second connection terminal is parallel to a thickness direction of the chip;
      an end of the second connection terminal is in contact with a top surface of a test circuit board located on a bottom surface inside the support box; and
      a length of the second connection terminal along the thickness direction of the chip is greater than or equal to a thickness of the chip.

2. The device for carrying a chip according to claim 1, wherein an orthographic projection of the end of the second connection terminal on the bottom surface is located inside an orthographic projection of the elastic body of a corresponding one of the first elastic snap rings on the bottom surface.

3. The device for carrying a chip according to claim 1, wherein a surface of the second connection terminal close to the chip is provided with an anti-slip material.

4. The device for carrying a chip according to claim 1, wherein a shape of the elastic body of each of the first elastic snap rings comprises at least one of a round shape, a C shape, a spiral shape, a wave shape, an ear shape, or an L shape.

5. The device for carrying a chip according to claim 1, wherein the second inner side wall of the support box is provided with a number of the first elastic snap rings.

6. The device for carrying a chip according to claim 1, further comprising:
   a plurality of second elastic snap rings, a first fixing terminal of each of the second elastic snap rings being provided on a third inner side wall of the support box adjacent to the first inner side wall, a second fixing terminal of each of the second elastic snap rings being suspended and being configured to be in contact with the chip and provide a pressure in a second direction for the chip because an elastic body of each of the second elastic snap rings is in the elastically compressed state, such that the chip is fastened between the second fixing terminal and a fourth inner side wall of the support box opposite to the third inner side wall.

7. The device for carrying a chip according to claim 6, wherein a shape of the elastic body of each of the second elastic snap rings comprises at least one of a round shape, a C shape, a spiral shape, a wave shape, an ear shape, or an L shape.

8. The device for carrying a chip according to claim 7, wherein an extension direction of the second fixing terminal is parallel to the thickness direction of the chip.

9. The device for carrying a chip according to claim 8, wherein an end of the second fixing terminal is in contact with the top surface of the test circuit board located on the bottom surface inside the support box; and a length of the second fixing terminal along the thickness direction of the chip is greater than or equal to the thickness of the chip.

10. The device for carrying a chip according to claim 9, wherein an orthographic projection of the second fixing terminal on the bottom surface is located inside an orthographic projection of the elastic body of a corresponding one of the second elastic snap rings on the bottom surface.

11. The device for carrying a chip according to claim 8, wherein a surface of the second fixing terminal close to the chip is provided with an anti-slip material.

12. A device for testing a chip, comprising:
   a test circuit board; and
   a device for carrying a chip, configured to fasten chips of different sizes, comprising:
      a support box, configured to carry the chip; and
      a plurality of first elastic snap rings, a first connection terminal of each of the first elastic snap rings being provided on a first inner side wall of the support box, a second connection terminal of each of the first elastic snap rings being suspended and being configured to be in contact with the chip and provide a pressure in a first direction for the chip because an elastic body of each of the first elastic snap rings is in an elastically compressed state, such that the chip is fastened between the second connection terminal and a second inner side wall of the support box opposite to the first inner side wall;

wherein an extension direction of the second connection terminal is parallel to a thickness direction of the chip; an end of the second connection terminal is in contact with a top surface of the test circuit board located on a bottom surface inside the support box; and a length of the second connection terminal along the thickness direction of the chip is greater than or equal to a thickness of the chip;

wherein, the device for carrying a chip is configured to carry the test circuit board and fasten the chip to an upper surface of the test circuit board, and wherein the test circuit board is configured to provide a test signal for the chip, to test the chip.

13. A method for testing a chip, comprising:

loading a test circuit board into a device for carrying a chip;

wherein the device for carrying a chip is configured to fasten chips of different sizes and comprises:

a support box, configured to carry the chip; and a plurality of first elastic snap rings, a first connection terminal of each of the first elastic snap rings being provided on a first inner side wall of the support box, a second connection terminal of each of the first elastic snap rings being suspended and being configured to be in contact with the chip and provide a pressure in a first direction for the chip because an elastic body of each of the first elastic snap rings is in an elastically compressed state, such that the chip is fastened between the second connection terminal and a second inner side wall of the support box opposite to the first inner side wall;

wherein an extension direction of the second connection terminal is parallel to a thickness direction of the chip; an end of the second connection terminal is in contact with a top surface of the test circuit board located on a bottom surface inside the support box; and a length of the second connection terminal along the thickness direction of the chip is greater than or equal to a thickness of the chip; and wherein the method further comprises:

loading the chip into the device for carrying a chip, and fastening the chip to an upper surface of the test circuit board, wherein the chip is fastened between the second connection terminal of each of the first elastic snap rings and the second inner side wall of the support box; and controlling the test circuit board to provide a test signal for the chip, to test the chip.

* * * * *